United States Patent
Gotoh et al.

[11] Patent Number: 5,924,874
[45] Date of Patent: Jul. 20, 1999

[54] IC SOCKET

[75] Inventors: Yoshihiro Gotoh; Yuji Kawanishi; Katsuhiro Ohtaka, all of Tokyo, Japan

[73] Assignee: Ando Electric Co., Ltd., Tokyo, Japan

[21] Appl. No.: 09/014,511

[22] Filed: Jan. 28, 1998

[30] Foreign Application Priority Data

Jan. 30, 1997 [JP] Japan .................................. 9-031232

[51] Int. Cl.$^6$ .................................................. H01R 9/09
[52] U.S. Cl. ............................................ 439/73; 439/631
[58] Field of Search .......................... 439/71, 72, 73, 439/331, 631

[56] References Cited

U.S. PATENT DOCUMENTS

| | | | |
|---|---|---|---|
| 4,897,054 | 1/1990 | Gilissen et al. | 439/631 |
| 4,941,832 | 7/1990 | Korsunsky et al. | 439/71 |
| 5,067,904 | 11/1991 | Takeuchi et al. | 439/72 |
| 5,576,937 | 11/1996 | Kubo | 439/71 |

*Primary Examiner*—Neil Abrams
*Assistant Examiner*—T C Patel
*Attorney, Agent, or Firm*—Flynn, Thiel, Boutell & Tanis, P.C.

[57] ABSTRACT

There is provided an IC socket capable of reducing inductance of contacts corresponding to a power supply pin and a ground pin of an IC, of increasing the level of impedance matching and of enabling the measurement of a high frequency IC. Contacts each formed of a single kind and comprising three contact portions and one curved portion are arranged in a straight line along grooves of an IC socket and the contacts are connected to a measuring circuit board which is inserted into the grooves of the IC socket through the three contact portions regardless of the curved portion.

5 Claims, 6 Drawing Sheets

FIG. 2 (A)
FIG. 2 (C)
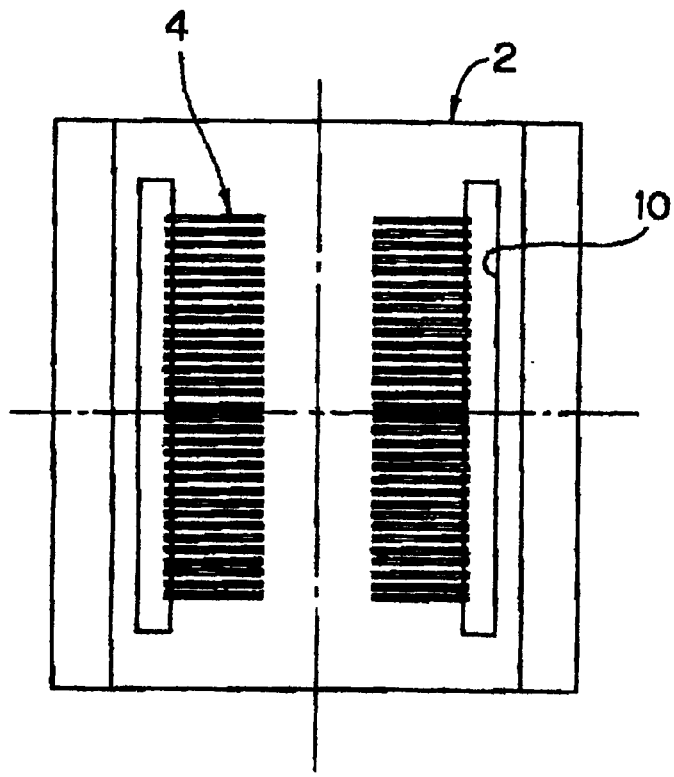
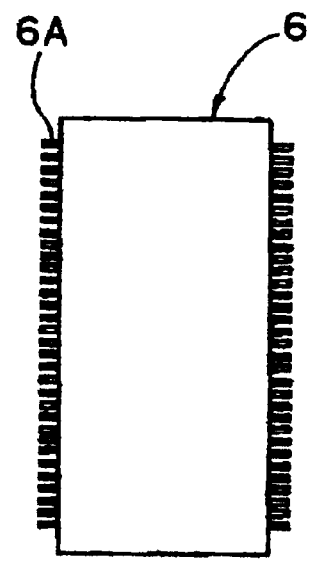
FIG. 2 (D)
FIG. 2 (B)
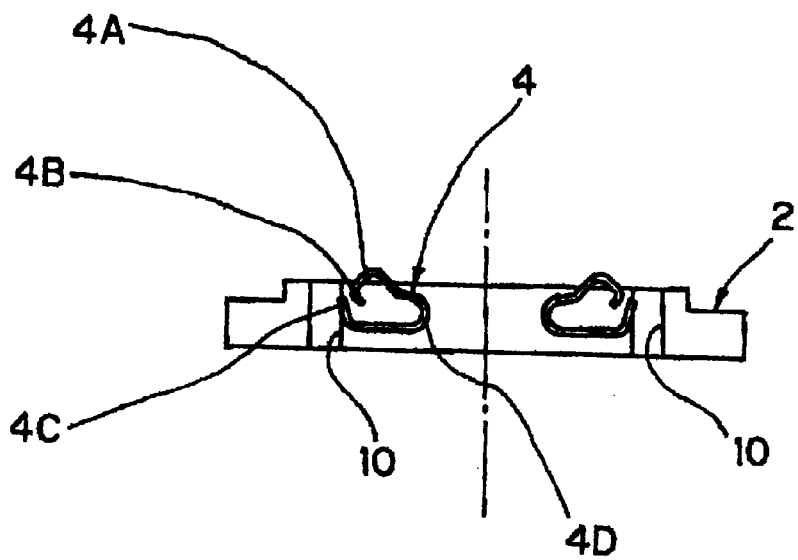

FIG. 7 (A) (PRIOR ART)
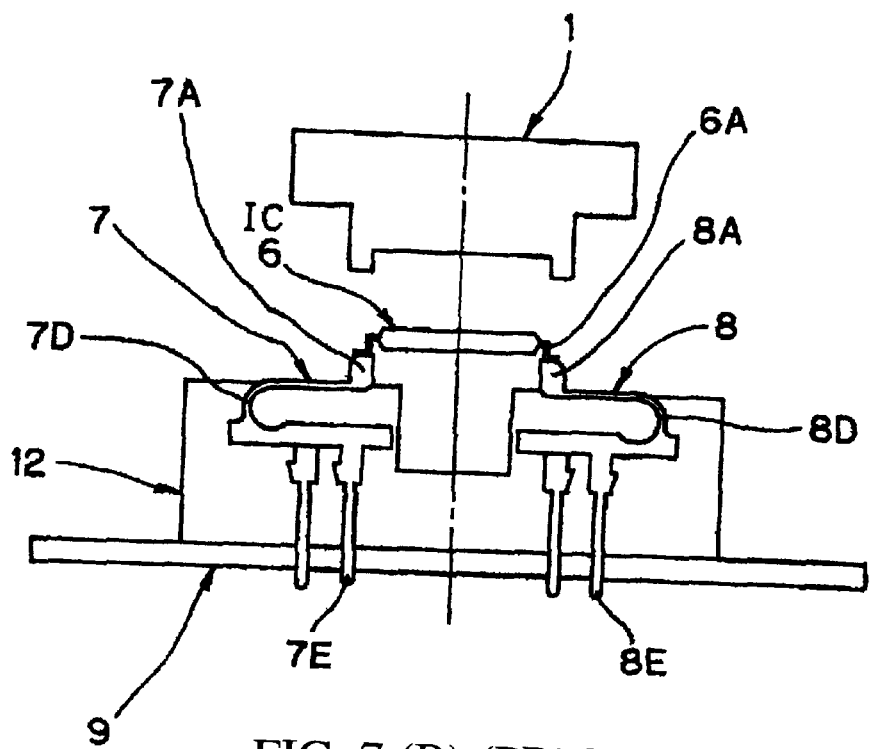
FIG. 7 (B) (PRIOR ART)
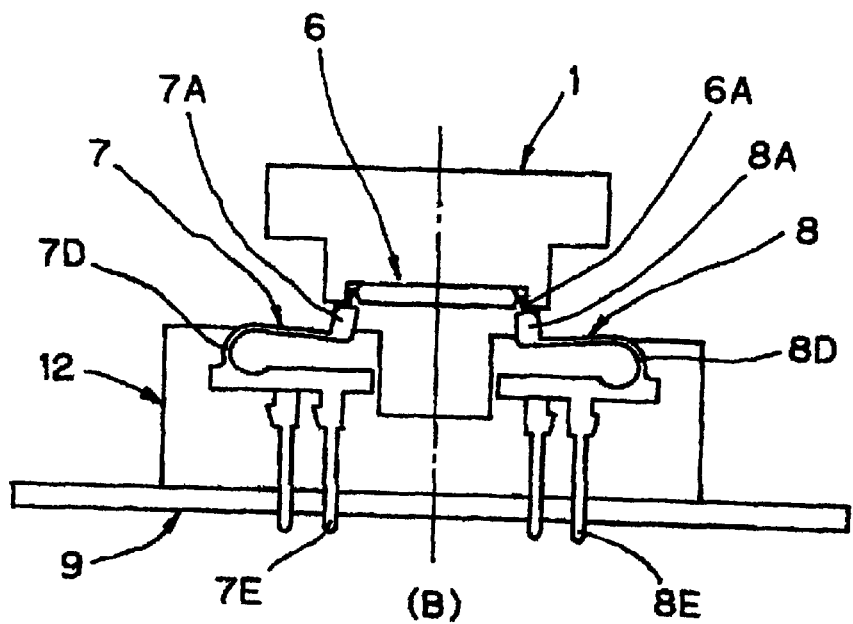

IC SOCKET

BACKGROUND OF THE INVENTION

1. Field of the Invention

The present invention relates to an IC socket, particularly to an IC socket which is used by an autohandler and incorporates therein contacts corresponding to each pin of the IC serving as a device to be measured.

2. Prior Art

A conventional IC socket 12 has, for example, a construction shown in FIG. 5.

In FIG. 5, the IC socket 12 is mounted on a socket board 9, and it incorporates therein contacts 7 and 8 each corresponding to each pin of an IC 6. The contacts 7 and 8 are respectively provided with contact portions 7A and 8A, curved portions 7D and 8D and leg portions 7E and 8E as shown in FIG. 6. Leads 6A each connected to each pin of the IC 6 contact the contact portions 7A and 8A when the IC 6 is measured.

To bring the contact portions 7A and 8A and the leads 6A into surely contact with one another when the IC 6 is measured, the curved portions 7D and 8D are curved to have elasticity.

Further, the leg portions 7E and 8E are respectively inserted into through holes 9A and 9B defined in the socket board 9 (FIG. 6) and the leg portions and the through holes are connected with one another by soldering, and the leg portions 7E and 8E are also connected to an IC tester (not shown) by a cable (not shown).

The contacts 7 and 8 are respectively made of a thin metal sheet having a thickness of e.g., about 0.3 mm to correspond the IC 6 having leads 6A of small pitches.

The operation of the IC socket 12 into which the contacts 7 and 8 are incorporated when measuring the IC 6 will be now described with reference to FIG. 7.

That is, the IC 6 is first transferred on the contacts 7 and 8 by a transfer mechanism (not shown), then the leads 6A of the IC 6 are placed on the contact portions 7A of the contacts 7 and the contact portions 8A of the contacts 8 (FIG. 7(A)), thereafter the leads 6A are pressed against the contact portions 7A and 8A by a contact presser 1, thereby surely bringing the leads 6A into contact with the contact portions 7A and 8A (FIG. 7(B)).

At this time, the contacts 7 and 8 are presser by the contact pressure 1 so that the curved portions 7B of the contacts 7 and the curved portions 8B of the contacts 8 are bent within the elasticity thereof as shown in FIG. 7(B).

In the conventional IC socket 12, the contacts 7 and 8 have the curved portions 7D and 8D as set forth above. Accordingly, the distance between the contact portions 7A and 8A which are portions contacting the leads 6A of the IC 6 and the socket board 9 are long (FIG. (7)).

Further, since the contacts 7 and 8 are alternately arranged and the intervals of the contacts 7 and 8 are small so as to correspond to the leads 6A having small pitches. That is, the contacts 7 and 8 are large in conductive distance but small in areas. Accordingly, the inductance of the contacts 7 and 8 is large.

Still further, since the interval between the contacts 7 and 8 is small, the through holes 9A and 9B are formed in a staggered shape (FIG. (6)) and the positions of the legs 7E and 8E of the contacts 7 and 8 correspond to the through holes 9A and 9B (FIG. (6)).

Accordingly, the distance between the contact portions 7A and the socket board 9 and that between the contact portions 8A and socket board 9 are different from each other, thereby differentiating the impedance thereof.

Further, there are many connecting points between the IC socket 12 and a measuring circuit board (not shown), and the IC 6 is measured through the IC socket 12, the socket board 9, a cable (not shown) and the measuring circuit board so that the impedance matching is low.

In these cases, in the conventional IC to which a signal having a frequency ranging from 50 to 60 MHz is applied, there is little influence on.

However there are such drawbacks in the conventional IC socket that in an IC to which a signal having a frequency ranging from 100 MHz or more is applied, a noise voltage is generated owing to a noise current which flows to a power supply, which is caused by large inductance of the contacts 7 and 8, or caused by the low impedance matching, thereby inferiority influencing upon the measurement to reduce measuring accuracy.

That is, the contacts corresponding to a power supply pin and a ground pin of the IC 6 are respectively spaced largely from one another with, and the areas thereof are small so that inductance thereof becomes large, thereby generating a noise voltage to inferiority influence upon the measurement.

Further, the distances between the contacts 7 and 8 corresponding to each pin of the IC 6 and the socket board 9 are different from each other, and there are many connecting points between the IC socket 12 and a measuring circuit board so that the impedance matching becomes insufficient, thereby inferiority influencing upon the measurement.

SUMMARY OF THE INVENTION

It is an object of the invention to provide an IC socket capable of reducing inductance of the contacts corresponding to a power supply pin and a ground pin of a IC and of increasing the impedance matching level, thereby measuring an IC to which high frequency signal is applied.

To achieve the above object, the present invention comprises as follows.

According to the present invention, since the contacts 3 and 4 are connected to the measuring circuit board 5 through three contact portions 3A to 3C and 4A to 4C regardless of the curved portions 3D and 4D (FIG. 3(B) and 4(B)), each length between the first contact portions 3A and 4A serving as the portions contacting the leads 6A of the IC 6 and the third contact portions 3C and 4C serving as the portions contacting edge connector terminals 6A of the measuring circuit board 5 is reduced, thereby reducing the inductance of the contacts corresponding to a power supply pin and a ground pin of the IC, dispensing with the interposing of a socket board and a cable to reduce the connecting points. Since the contacts 3 and 4 are formed of a single kind and the distances between the first contact portions 3A and 4A and the measuring circuit board 5 are the same, and they are not staggered (FIG. (6)) but linearly arranged (FIG. 1(A) and FIG. 2(A)), thereby increasing the level of the impedance matching so that the high frequency IC can be measured.

BRIEF DESCRIPTION OF THE DRAWINGS

FIGS. 2(A) to 2(D) are views showing an entire construction of an IC socket according to a second embodiment of the present invention;

FIGS. 7(A) and 7(B) are views showing the operation of the conventional IC socket.

PREFERRED EMBODIMENT OF THE INVENTION

An IC socket according to a first embodiment of the invention will be now described with reference to FIGS. 1 and 3.

In FIGS. 1(A) to 1(D), contacts 3 corresponding to each pin of an IC 6 are incorporated into an IC socket 2, and grooves 10 in which a measuring circuit board 5 (FIG. 3), described later, is inserted is defined in the IC socket 2.

Figure 1:
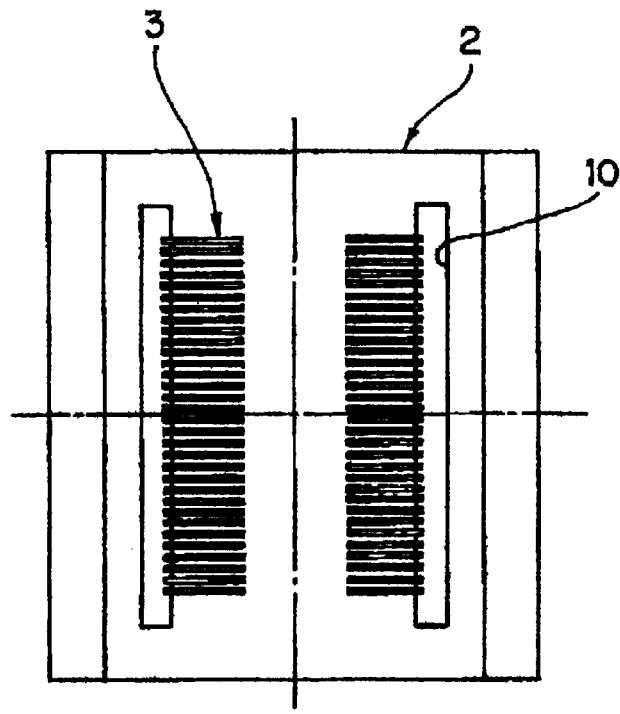
FIGS. 1(A) to 1(D) are views showing an entire construction of an IC socket according to a first embodiment of the present invention.
Figure 1:
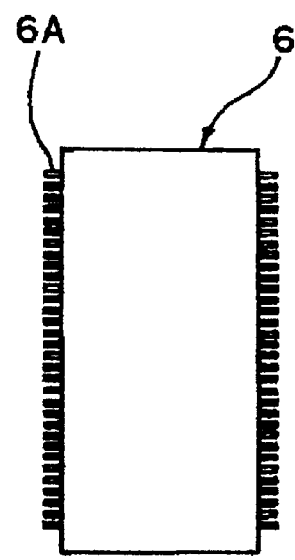
Figure 1:
Figure 1:
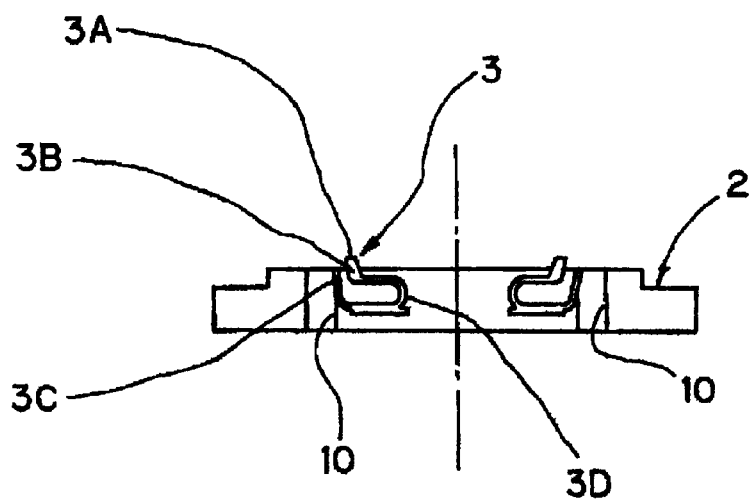

The IC 6 which is a device to be measured has 32 pieces of leads 6A each connected to a pin of the IC 6 at left and light sides, directing to the figure, as shown in FIGS. 1 (C) and (D). When the IC 6 is measured, described later, the leads 6A are mounted on the contacts 3 which are incorporated into the IC socket 2 as shown in FIG. 3.

The contacts 3 incorporated into the IC socket 2 correspond to the position of each pin of the IC 6, and 32 pieces of contacts 3 are arranged at the left and right sides thereof as shown in FIG. 1(A).

The contacts 3 are formed of a single kind and are arranged linearly along the grooves 10 (FIG. 1(A)).

Figure 6:
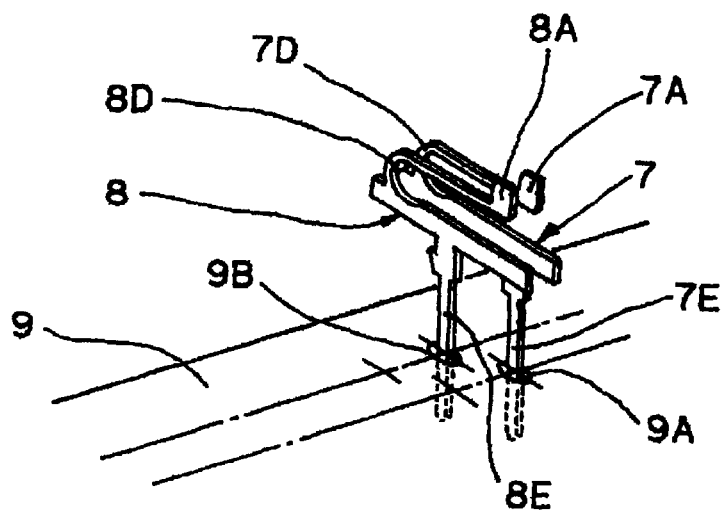
FIG. 6 is a view showing contacts of the conventional IC socket.

That is, according to the contacts 3, the distances between the first contact portions 3A and the measuring circuit board 5, described later, are all the same and are formed of the same kind, and also arranged linearly (FIG. 1(A)), different from the conventional staggered arrangement of the conventional IC socket (FIG. 6), and hence there is no difference in impedance.

The contacts 3 comprise first contact portions 3A, second contact portions 3B, third contact portions 3C and curved portions 3D wherein the second contact portions 3B and third contact portions 3C oppose each other.

The leads 6A of IC 6 contact the first contact portions 3A, and the third contact portions 3C, described later, contact the second contact portions 3B when the leads 6A is pressed by the contact pressure 1 (FIG. 3(B)), wherein the first contact portions 3A and second contact portions 3B are adjacent to each other as illustrated.

The second contact portions 3B are portions which are bent when the leads 6A are pressed against the first contact portions 3A by the contact presser 1 (FIG. 3(B)).

Further, the measuring circuit board 5, described later, contacts the third contact portions 3C and the third contact portions 3C protrude into the grooves 10 defined in the IC socket 2.

When viewing the contacts 3 from the side surface (FIG. 1(B)), the third contact portions 3C protruding into the grooves 10 of the IC socket 2 extend downward and stretch to the curved portions 3D, and the curved portions 3D depict U shapes and stretch to the second contact portions 3B while the second contact portions 3B stretch to the first contact portions 3A which protrude upward from the IC socket 2.

On the other hand, edge connector terminals 5A corresponding to the contacts 3 incorporated into the IC socket 2 are mounted on the measuring circuit board 5, and they are detachable relative to the grooves 10 defined in the IC socket 2.

Accordingly, as shown in FIGS. 3(A) and 3(B), when the measuring circuit board 5 is inserted into the grooves 10, the edge connector terminals 5A contact the third contact portions 3C which protrude into the groove 10.

Figure 3:
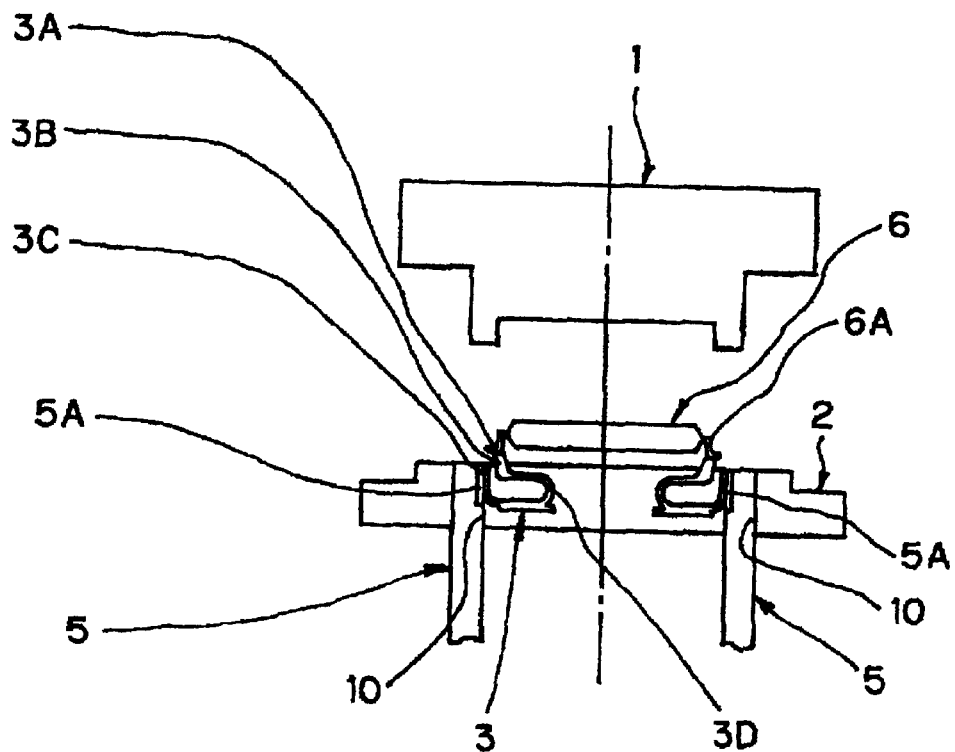
FIGS. 3(A) to 3(B) are views showing the operation of the IC socket according to the first embodiment of the invention.
Figure 3:
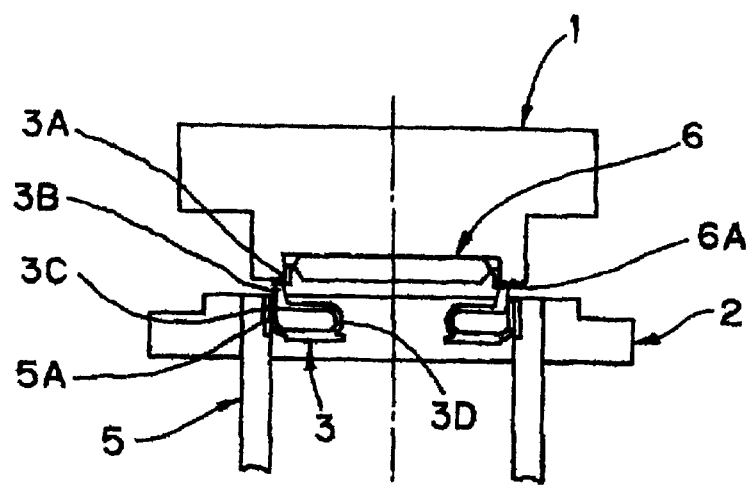

The operation of the IC socket of the first embodiment having the construction set forth above will be now described in reference to FIG. 3.

(1) preparation before measuring the IC 6

Before the measurement, the measuring circuit board 5 is inserted into the grooves 10 of the IC socket 2 shown in FIG. 3 (A), then the IC 6 is transferred on the contacts 3 in advance by a transfer mechanism (not shown), then the leads 6A of the IC 6 are mounted on the first contact portions 3A of the contacts 3.

At this time, although the third contact portions 3C of the contacts 3 contact the edge connector terminals 5A of the measuring circuit board 5, the second contact portions 3B of the contacts 3 do not contact the third contact portions 3C of the contacts 3 (FIG. 3(A)).

(2) Operation when measuring the IC 6

Subsequently, when the leads 6A are pressed against the first contact portions 3A by the contact pressure 1 as shown in FIG. 3 (B), the leads 6A and contacts 3 are forcibly brought into contact with each other.

At this, since the curved portions 3D are bent at the same time, the second contact portions 3B are moved outward the IC socket 2 so that the second contact portions 3B and the third contact portions 3C are brought into contact with each other (FIG. 3(B)).

Consequently, the first contact portions 3A are connected to the measuring circuit board 5 by way of the second and third contact portions 3B and 3C regardless of the curved portions 3D.

Accordingly, the length extending from the first contact portions 3A serving as portions contacting the leads 6A of the IC 6 to the third contact portions 3C serving as portions contacting the edge connector terminals 5A of the measuring circuit board 5 is reduced, thereby reducing the inductance of the contacts corresponding to a power supply pin and a ground pin of the IC.

Further, since the IC 6 is measured without resorting to a socket board and a cable, the connecting points are reduced. Inasmuch as the distances between the first contact portions 3A of the contacts 3 and the measuring circuit board 5 are the same, and the contacts 3 are formed of a single kind and are not staggered (FIG. 6) but arranged linearly (FIG. 1(A)), the level of impedance matching is increased. As a result, the high frequency IC can be measured.

An IC socket according to a second embodiment of the invention will be now described with reference to FIGS. 2 and 4.

The second embodiment is different from the first embodiment in respect to the shapes of the contacts 3.

That is, the contacts 3 in FIG. 1 and contacts 4 in FIG. 2 are the same in respect of the second and third contact portions which oppose each other.

However, although the second contact portions 3B of the contacts 3 in FIG. 1 are positioned in the curved portions 3D, the second contact portions 4B of the contacts 4 in FIG. 2 are positioned in the tip end sides thereof.

Figure 4:
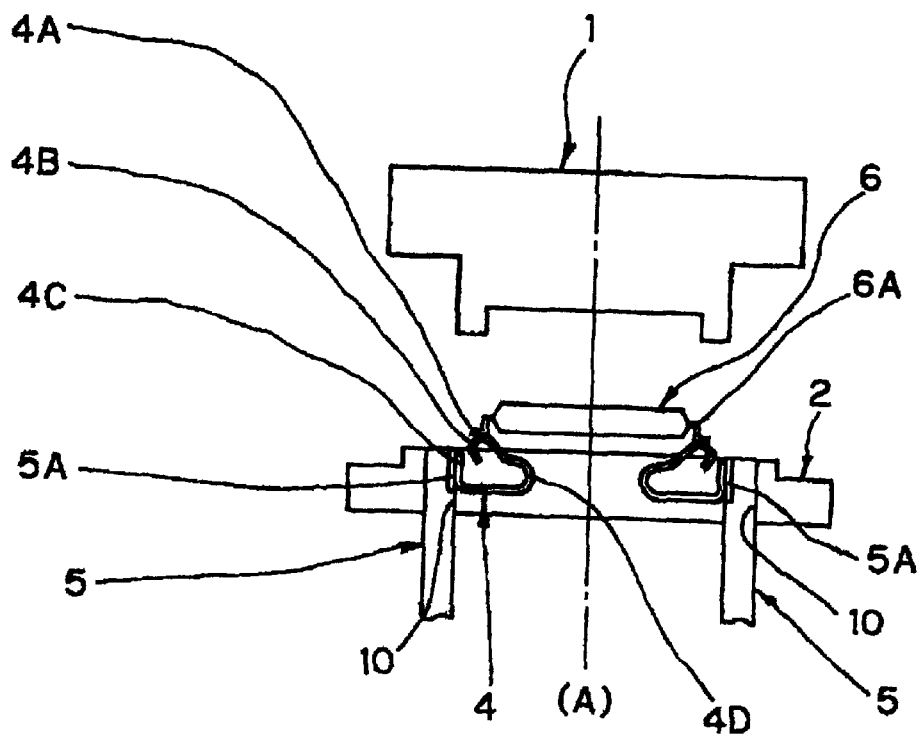
FIGS. 4(A) to 4(B) are views showing the operation of the IC socket according to the second embodiment of the invention.
Figure 4:
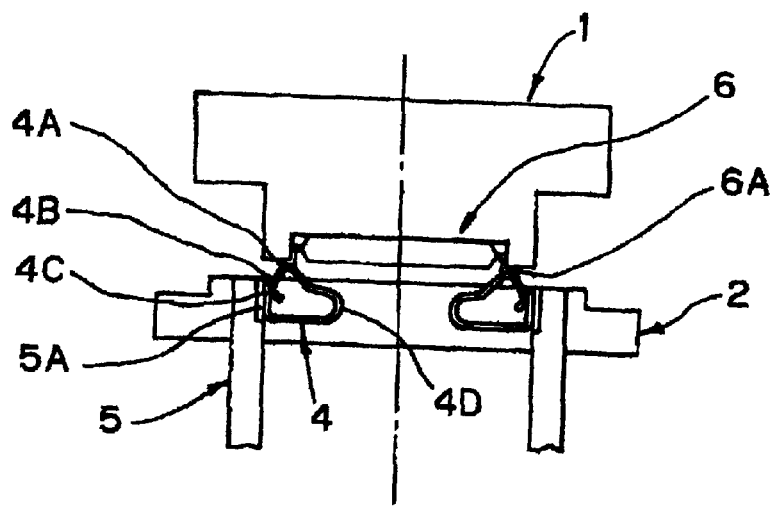
Figure 5:
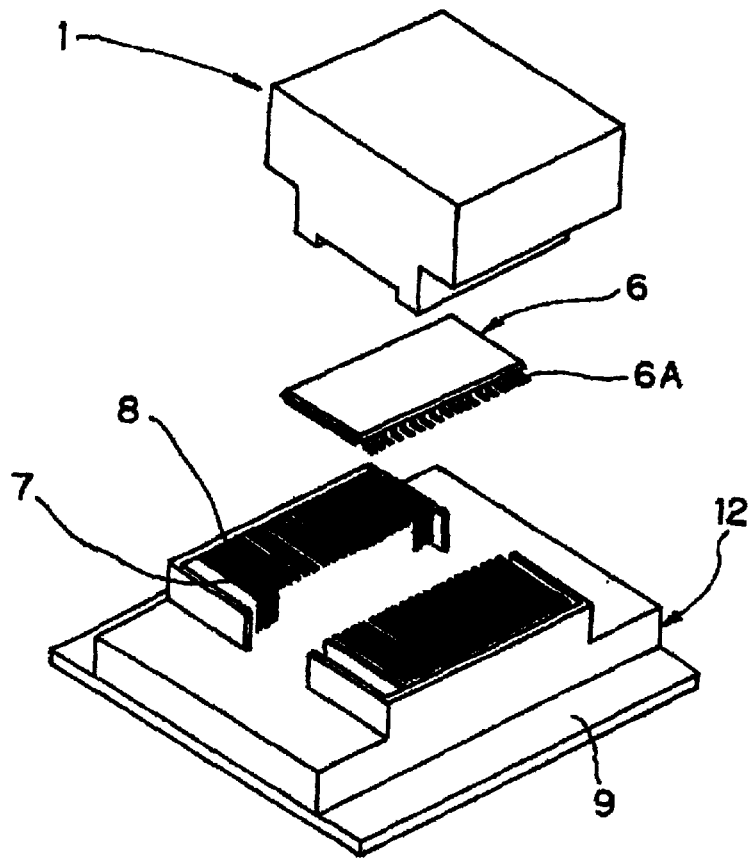
FIG. 5 is a view showing an entire construction of a conventional IC socket.

The operation of the second embodiment in FIG. 2 is described in FIG. 4 which is the same as that of the first embodiment shown in FIG. 3, and hence the explanation thereof is omitted.

As set forth above in detail, since each contact comprises three contact portions and one curved portion, the contacts can be connected to the measuring circuit board only by the three contact portions so that each contact can be reduced regardless of the length of the curved portion and also the inductance of the contacts relative to the power supply pin and ground pin of the IC is reduced. Further, the connecting points of the IC can be reduced because the IC can be measured without resorting to the socket board and cable, and also the contacts are formed of a single kind and also they are arranged linearly so that the impedance matching is made high, thereby enabling the measurement of high frequency ICs.

What is claimed is:

1. An IC socket comprising:

grooves defined in said IC socket;

contacts opposing each other, each contact corresponding to a respective pin of an IC, said contacts being formed of a single kind and arranged in a straight line along the grooves;

wherein said contacts comprise first contact portions, second contact portions, third contact portions and curved portions;

wherein said third contact portions of the contacts contact edge connector terminals which are mounted on a measuring circuit board when the measuring circuit board is inserted into the grooves; and wherein leads, each connected to the respective pin of the IC, contact said first contact portions and said curved portions which are bent when the leads are mounted on said contacts, then the leads are pressed by a contact presser, so that said second contact portions are moved to contact said third contact portions.

2. The IC socket according to claim 1, wherein said first contact portions and second contact portions of said contacts adjoin each other.

3. The IC socket according to claim 1, wherein said first contact portions and said curved portions of said contacts adjoin each other.

4. The IC socket according to claim 1, wherein said second contact portions of said contacts are positioned in the tip end sides thereof.

5. The IC socket according to claim 1, wherein said measuring circuit board is detachably attached to said grooves.

* * * * *